(12) United States Patent
Collins et al.

(10) Patent No.: US 12,730,941 B2
(45) Date of Patent: Sep. 8, 2026

(54) COMBINED MICROSTRUCTURE AND OBJECT BOUNDARY REPRESENTATIONS OF COMPUTER-AIDED DESIGN OBJECTS

(71) Applicant: Siemens Industry Software Inc., Plano, TX (US)

(72) Inventors: Richard Charles Collins, Cambridge (GB); Peter Philip Lonsdale Nanson, Cambridge (GB)

(73) Assignee: Siemens Industry Software Inc., Plano, TX (US)

(*) Notice: Subject to any disclaimer, the term of this patent is extended or adjusted under 35 U.S.C. 154(b) by 1084 days.

(21) Appl. No.: 17/779,383

(22) PCT Filed: Dec. 5, 2019

(86) PCT No.: PCT/US2019/064624

§ 371 (c)(1),
(2) Date: May 24, 2022

(87) PCT Pub. No.: WO2021/112848

PCT Pub. Date: Jun. 10, 2021

(65) Prior Publication Data

US 2022/0414277 A1 Dec. 29, 2022

(51) Int. Cl.
*G06F 7/48* (2006.01)
*G06F 30/12* (2020.01)

(52) U.S. Cl.
CPC .................................... *G06F 30/12* (2020.01)

(58) Field of Classification Search
CPC ................................. G06F 30/10; G06F 30/12
See application file for complete search history.

(56) References Cited

U.S. PATENT DOCUMENTS 8,253,726 B1 8/2012 Desimone et al.
2003/0176994 A1 9/2003 Spitz et al.
(Continued)

FOREIGN PATENT DOCUMENTS

CN 103914865 A 7/2014
CN 106716498 A 5/2017
(Continued)

OTHER PUBLICATIONS

Pasko Alexander et al:; "Proceduralfunction-basedmodelling ofvolumetricmicrostructures"; Graphical Models; Mar. 3, 2011; pp. 165-181.

(Continued)

*Primary Examiner* — Nithya J. Moll

(57) ABSTRACT

A computing system may include an object representation engine and an object incarnation engine. The object representation engine may be configured to define a computer-aided design (CAD) object in a CAD model as a combination of an object boundary comprised of bounding faces that encapsulate the CAD object and a microstructure that defines an internal geometry of the CAD object in a procedural representation. The procedural representation may be a representation of the internal geometry of the CAD object in a non-incarnated form. The object incarnation engine may be configured to incarnate, via the procedural representation of the microstructure, the internal geometry of the CAD object into a geometric representation to perform a CAD operation on the CAD object.

17 Claims, 5 Drawing Sheets

(56) References Cited

U.S. PATENT DOCUMENTS

| | | | | |
|---|---|---|---|---|
| 2015/0193559 | A1 | 7/2015 | Musuvathy | |
| 2019/0197773 | A1 | 6/2019 | Schmidt et al. | |
| 2020/0211279 | A1* | 7/2020 | Randon | G06T 17/005 |
| 2020/0211281 | A1* | 7/2020 | Randon | G06T 17/005 |
| 2021/0232120 | A1* | 7/2021 | Marinov | G06F 30/10 |

FOREIGN PATENT DOCUMENTS

| | | | |
|---|---|---|---|
| CN | 107949868 | A | 4/2018 |
| CN | 110110474 | A | 8/2019 |
| WO | 2012058604 | A2 | 5/2012 |

OTHER PUBLICATIONS

Video:; Jerry registered, [Rhino +Grasshoppertutorial] Voronoi-TsienPolygonalSurface 3DModelingComplete Tutorial, Nov. 4, 2019; https://www.bilibili.com/video/BV10E411q7FF/.

Zhang Chrnglin et al:; "Uniform DataStructureSupportingManifold andNon-ManifoldModeling"; Shanghai Aerospace; 04 Aug. 25, 2017.

Pasko, Alexander et al: "Procedural function-based modelling of volumetric microstructures", Graphical Models, vol. 73, No. 5 , Mar. 3, 2011 (Mar. 3, 2011), pp. 165-181, XP028271873, 18 pages.

Kurtz, Aidan: "Intralattice User Documentation", Nov. 14, 2015 (Nov. 14, 2015), XP055644097, 32 pages.

DCO graphicstudio: "Rhino Grasshopper Voroni 3D & Populate 30 Components Quick Tip", Sep. 20, 2019 (Sep. 20, 2019), XP054980808, 1 page.

PCT Search Report dated Oct. 2, 2020, for PCT Application No. PCT/US2019/064624, 15 pages.

* cited by examiner

COMBINED MICROSTRUCTURE AND OBJECT BOUNDARY REPRESENTATIONS OF COMPUTER-AIDED DESIGN OBJECTS

BACKGROUND

Computer systems can be used to create, use, and manage data for products and other items. Examples of computer systems include computer-aided design (CAD) systems (which may include computer-aided engineering (CAE) systems), computer-aided manufacturing (CAM) systems, visualization systems, product data management (PDM) systems, product lifecycle management (PLM) systems, and more. These systems may include components that facilitate the design and simulated testing of product structures and product manufacture.

BRIEF DESCRIPTION OF THE DRAWINGS

Certain examples are described in the following detailed description and in reference to the drawings.

DETAILED DESCRIPTION

Figure 1:
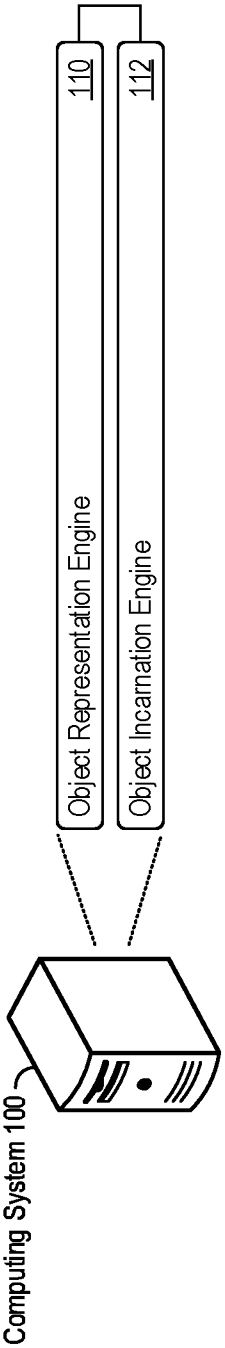
FIG. 1 shows an example of a computing system that supports combined microstructure and object boundary representations of CAD objects.

CAD systems and applications can support the creation, design, representation, and use of CAD objects in various forms. As used herein, CAD objects may include objects used in various types of design, testing, simulation, and manufacturing systems or applications, including objects of CAE systems, CAM systems, and more. One common form used by CAD applications is a 3-dimensional (3D) boundary representation (also referred to as a B-Rep). B-Reps may define the object boundary of a CAD object through 1-dimensional (1D) or 2-dimensional (2D) geometric elements, such as curves, edges, faces, surfaces, meshes, etc. Boundary representation models, by their nature, may be limited to describe only the boundaries of a CAD object, e.g., geometry that forms an outer boundary of the CAD object. Regions enclosed by boundary representations are typically limited in classification merely as wholly solid or wholly void.

As such, B-Rep definitions of CAD objects may be incapable or inefficient at capturing complex internal geometries of CAD objects. As additive manufacturing, 3D printing, topology optimization, and other 3D technologies become increasing viable, the design and manufacture of 3D parts with geometrically complex internal and external structures is becoming increasingly feasible. As used herein, additive materials may refer to an internal composition of a CAD object, and may be configured as a complex intermeshing of solid and void and may be wholly or partially enclosed by a layer of solid material as represented via a B-Rep or other object boundary. Additive materials and other complex 3D geometries, when modeled geometrically through boundary-representations (e.g., mesh faces), may require compositions of millions of geometric elements (or more) and include considerable geometric intricacy (e.g., high genus, highly curved, variable and irregular). Additive materials are not well-suited for representation by standard B-Rep forms. Naïve implementations of complex 3D geometries via B-Reps, whether to model internal additive materials or complex exterior geometry, can incur significant performance and memory penalties required to process millions of mesh elements or more.

The disclosure herein may provide systems, methods, devices, and logic for combined microstructure and object boundary representations of CAD objects. As described in greater detail herein, combined representation features may provide capabilities to represent or otherwise define CAD objects as a combination of both a B-Rep and a procedural definition (e.g., a programmatically defined internal geometry). For example, the features described herein may support a procedural definition (e.g., a programmatically defined internal geometry) embedded as part of a geometric representation (e.g., a B-Rep) of CAD objects. By representing a given CAD object together as combination of B-Rep geometry and procedural definitions, the combined representation features described herein may increase the efficiency and effectiveness of constructing, editing, simulating, and representing CAD objects. Such a combined representation may have a (potentially significantly) lesser memory footprint than a naïve B-Rep representation of the same structure, which may yield benefits by reducing computational latencies and memory requirements.

In some examples, a procedural definition of 3D geometry may be provided via a microstructure. As used herein, a microstructure may refer to a representation of a CAD object (or portion thereof) that is procedurally-defined. A microstructure may include a kernel that is repeated across an internal region of a CAD object as outlined by an object boundary, which may thus define an internal geometry of the CAD object programmatically. In some implementations described herein, microstructures may be embedded within or otherwise combined with B-Reps of CAD objects to form combined representations of CAD objects in a CAD model.

The described combined representation features may provide associative capabilities between an object shape and internal structure. Edits to an object boundary may correspondingly update the procedural definition and vice versa. Also, CAD operations that are material-dependent may incarnate corresponding portions of a CAD object via procedural definitions embedded in the CAD object, doing so selectively as required for a given CAD operation. In doing so, a CAD application utilizing the combined representation features described herein need not incarnate complex 3D geometries at all times, and may instead do so specifically to compute specific material-dependent CAD operations such as mass-property calculations, rendering, sectioning, slice, other Boolean operations for 3D printing preparation, and the like.

Accordingly, the combined representation features presented herein may increase the associativity between CAD object boundaries and internal geometric structures and preserve design intent. Geometry incarnation based on material-dependent CAD operations may reduce the cost of integration into existing CAD systems, and may provide efficiency benefits by not requiring incarnation for the entirety of internal or external 3D geometries to perform material-dependent or material-independent CAD operations.

These and other combined representation features and technical benefits are described in greater detail herein.

FIG. 1 shows an example of a computing system 100 that supports combined microstructure and object boundary representations of CAD objects. The computing system 100 may take the form of a single or multiple computing devices such as application servers, compute nodes, desktop or laptop computers, smart phones or other mobile devices, tablet devices, embedded controllers, and more. In some implementations, the computing system 100 implements a CAD system, tool, application, or program to aid users in the design, analysis, simulation, and manufacture of products and 3D parts.

As an example implementation to support any combination of the combined representation features described herein, the computing system 100 shown in FIG. 1 includes an object representation engine 110 and an object incarnation engine 112. The computing system 100 may implement the engines 108 and 110 (including components thereof) in various ways, for example as hardware and programming. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engines using the same computing system features or hardware components (e.g., a common processor or a common storage medium).

In operation, the object representation engine 110 may define a CAD object in a CAD model as a combination of an object boundary comprised of bounding faces that encapsulate the CAD object and a microstructure that defines an internal geometry of the CAD object in a procedural representation. The internal geometry of the CAD object defined by the microstructure may be one of multiple interior regions of the CAD object (others of which may be defined by other microstructures, solid space, or combinations of both) or may define the internal geometry of the entire interior of the CAD object. The procedural representation of the microstructure may be a representation of the internal geometry of the CAD object in a non-incarnated form (e.g., a programmatic definition). In operation, the object incarnation engine 112 may incarnate, via the procedural representation of the microstructure, the internal geometry of the CAD object into a geometric representation to perform a CAD operation on the CAD object.

Figure 2:
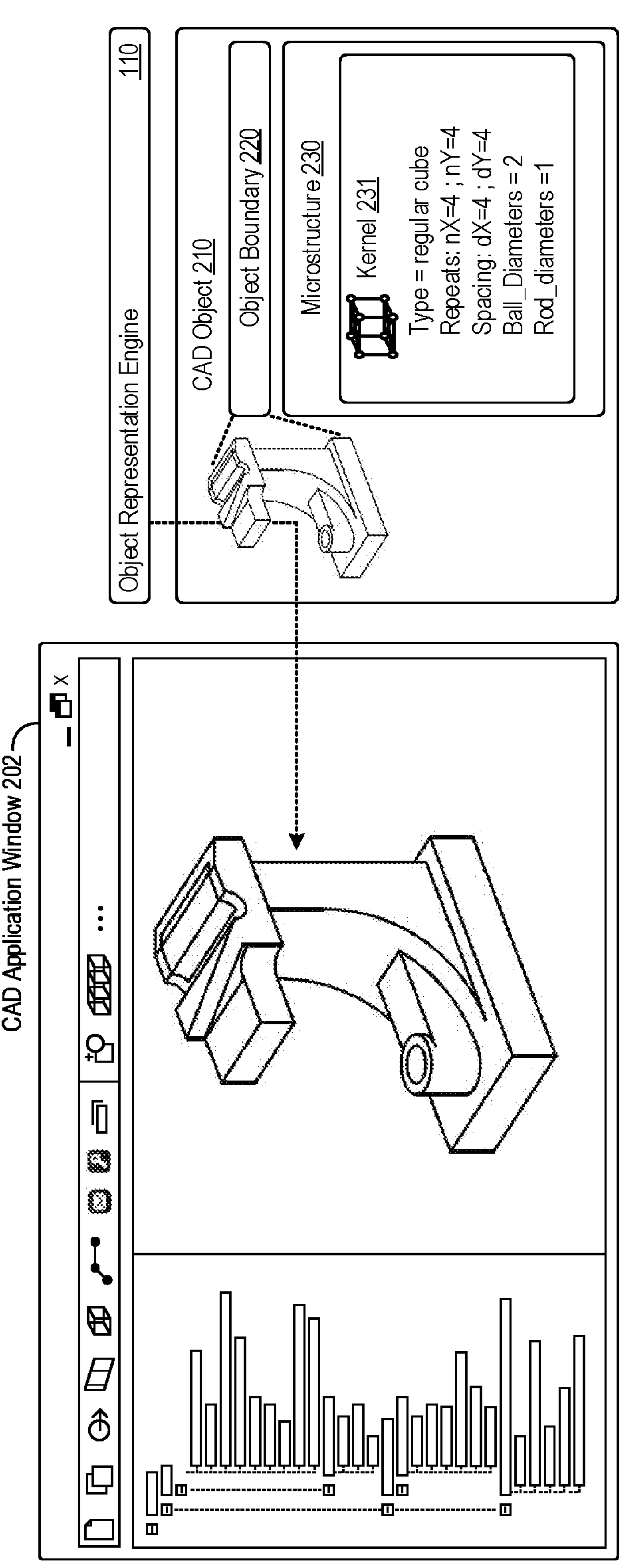
FIG. 2 shows an example of a combined representation of a CAD object by an object representation engine.

These and other combined representation features are described in greater detail next. FIG. 2 describes example object representation features of the present disclosure and FIG. 3 describes example object incarnation features of the present disclosure. While some specific examples are provided herein within the context of additive materials and internal 3D lattice geometries, any of the combined representation features described herein may be consistently applied any type of CAD objects and 3D geometries (whether internal or external).

FIG. 2 shows an example of a combined representation of a CAD object by the object representation engine 110. In FIG. 2, an interface of a CAD application is depicted through the CAD application window 202, which may visualize CAD models comprising CAD objects and provide capabilities to view, edit, or process CAD objects through CAD operations. The CAD application window 202 depicts a CAD object 210, which the object representation engine 110 may define as a combined representation. In some examples, the object representation engine 110 may be implemented as a component of the CAD application itself.

The object representation engine 110 may define the CAD object 210 as a combination of an object boundary 220 and a microstructure 230. The object boundary 220 may specify an exterior of the CAD object 210 in that it may represent or define an enclosed region of the CAD object 210. In some instances, the object representation engine 110 may configure the object boundary 220 in a B-Rep form, e.g., as a set of mesh faces or other bounding faces that define a boundary for a 3D volume. For conventional B-Rep object boundaries, the interior region enclosed by the B-Rep may represent a solid or filled portion of a CAD object. In the present disclosure, however, the object representation engine 110 may define a geometry of the interior region enclosed by the object boundary 220 via a procedural definition (e.g., in contrast to a completely solid definition).

In a combined representation of the CAD object 210, the object representation engine 110 may define an interior region (e.g., an internal geometry) bounded by the object boundary 220 through microstructures. A microstructure may include any procedurally-defined representation of CAD geometry that defines a 2D or 3D geometry of an interior region of a CAD object enclosed by an object boundary of the CAD object. In FIG. 2, the object representation engine 110 defines the CAD object 210 in part through the microstructure 230. As described herein, a microstructure 230 may provide a procedural (e.g., programmatic) representation of a 3D geometry that is bounded by the object boundary 220 of the CAD object 210.

The procedural representation of the microstructure may include a procedurally-defined kernel that is repeated across an interior of the object boundary to define the internal geometry of the CAD object 210. Microstructure kernels may thus be 2D or 3D geometric designs represented programmatically and patterned across an interior region of the CAD object 210 to define (at least part of) the internal geometry of the CAD object 210. In FIG. 2, an example microstructure kernel is depicted as the kernel 231, which may take the form of a 3D cube object with various kernel parameters and programmatic definitions that can be used to procedurally define an internal geometry of the CAD object 210.

Procedural representations by microstructures (e.g., the microstructure 230) may be implemented in various forms. In some instances, kernel-based procedural definitions are provided to pattern across internal CAD object geometries. As another example, code-based representations of CAD geometry may be used to procedurally define a microstructure (e.g., in C++ or any other programming language). Additive materials may be defined procedurally via microstructures, and example additive material structures include 2D and 3D lattice structures, honeycomb patterning structures, foam-like geometries, and many more that vary based on 3D part design, industrial applicability, design preferences, physical characteristics, and the like.

The object representation engine 110 may combine the object boundary 220 and procedurally-defined microstructure 230 to represent the CAD object 210 in various ways. In some instances, the object representation engine 110 links the object boundary 220 and microstructure 230 in a common (e.g., single) data structure such that modifications to the object boundary 220 impact the microstructure 230 (at least in scope) or vice versa. Accordingly, the object representation engine 110 may associatively link (e.g., directly link) the object boundary 220 and the microstructure 230 and may do so in a way that a definition of the object boundary 220 depends on the definition of the microstructure 230 or vice versa.

As an illustrative example, a CAD application may modify the object boundary 220 of the CAD object 210 (e.g., via user input to enlarge, reduce, or otherwise modify a B-Rep of the CAD object 210). In response to such a modification, the object representation engine 110 may adapt the microstructure 230 that defines the internal geometry of the CAD object to account for the change in the object boundary 220. Such adaptation may be to extend the microstructure 230 to fill an added internal region resulting from an extension to the object boundary 220, trim the range of the microstructure 230 to account for a reduction in the object boundary 220, and the like. As another example, the object representation engine 110 engine may implement conformal lattices to automatically adjust a procedural definition via the microstructure 230 (e.g., shape, size, or other parameter) based on changes to the object boundary 220.

In some examples, the object representation engine 110 may define the object boundary 220 as a B-Rep model and embed the microstructure 230 (e.g., a procedural representation of an internal geometry of the CAD object 210) within the B-Rep model itself. As such, the object representation engine 110 may provide a single data structure (e.g., a B-Rep) that itself can include one or multiple microstructures that define the geometry of interior regions of the B-Rep. As another example, the object representation engine 110 may define a 3D region via the microstructure 230 that is bounded in volume by the object boundary 220. Explained in a different way, the boundary of a 3D region defined procedurally through the microstructure 230 may extend as far as a bounding limit as defined by the object boundary 220 (e.g., up to the bounding faces of the CAD object). In these examples, the object representation engine 110 may combine a B-Rep with a procedural representation, which may associatively link boundary and interior regions of a CAD object (e.g., in contrast to separate or distinct B-Rep and programmatic definitions of objects that are not directly interdependent).

In some examples, the object representation engine 110 may define part, but not all, of an interior region of a CAD object via procedurally-defined microstructures. In such examples, an interior region of a CAD object may be partially solid and partially defined procedurally via microstructures. To support such a feature, the object representation engine 110 may partition the internal geometry of a CAD object (as bounded by the object boundary), doing so with part of the partitioned internal geometry set as solid (e.g., according to a conventional B-Rep model) and another part of the partitioned internal geometry defined procedurally via a microstructure. Partitioning by the object representation engine 110 may performed via cellular topological structures, cellular topology, or cell-based frameworks.

CAD objects with procedurally-defined internal geometries (whether in whole or in part) may be recognized as non-manifold geometries by CAD applications. This may be the case as partitioning an internal geometry of a CAD object into solid partition and procedurally-defined lattice partition may result in a non-manifold object, as interpreted by CAD geometric modelers or other CAD application components. To address such an issue, the object representation engine 110 may represent CAD objects to CAD application components via the object boundary 220, which may be a B-Rep and thus interpreted as a manifold 3D object. In that sense, CAD application components may recognize or interpret a CAD object based on the object boundary 220, which may represent an "envelope" of the CAD object, but geometric modelers or other CAD application components that can process internal CAD object geometries may interpret the CAD object 210 as a combined representation defined via both the outer boundary 220 and microstructure 230.

In some examples, the object representation engine 110 may represent CAD objects defined via combined representations based on whether a CAD application component can process manifold or non-manifold objects. To illustrate through FIG. 2, the object representation engine 110 may represent the CAD object 210 as a non-manifold object to a geometric modeler component of a CAD application, as the modeler may support non-manifold operations or processing of CAD objects. However, the object representation engine 110 may mask the non-manifold object by representing the CAD object 210 as a manifold object to different components of the CAD application. Thus, from a system level, a CAD application may recognize the CAD object 210 (defined as combined representation) as a manifold object, even if the object representation engine 110 partitions the CAD object 210 into a non-manifold 3D object for partial procedural definition via the microstructure 230.

In any of the ways described herein, the object representation engine 110 may define a CAD object as a combined representation that includes both an object boundary and a microstructure that procedurally-defines an internal geometry of the CAD object. As the internal geometry of a CAD object may be represented procedurally (as compared to an explicit geometric representation), material-dependent CAD operations may require incarnation of CAD objects into a geometric form in order to be properly performed. The combined representation features described herein may support incarnation of combined representation CAD objects, e.g., as described next in connection with FIG. 3.

Figure 3:
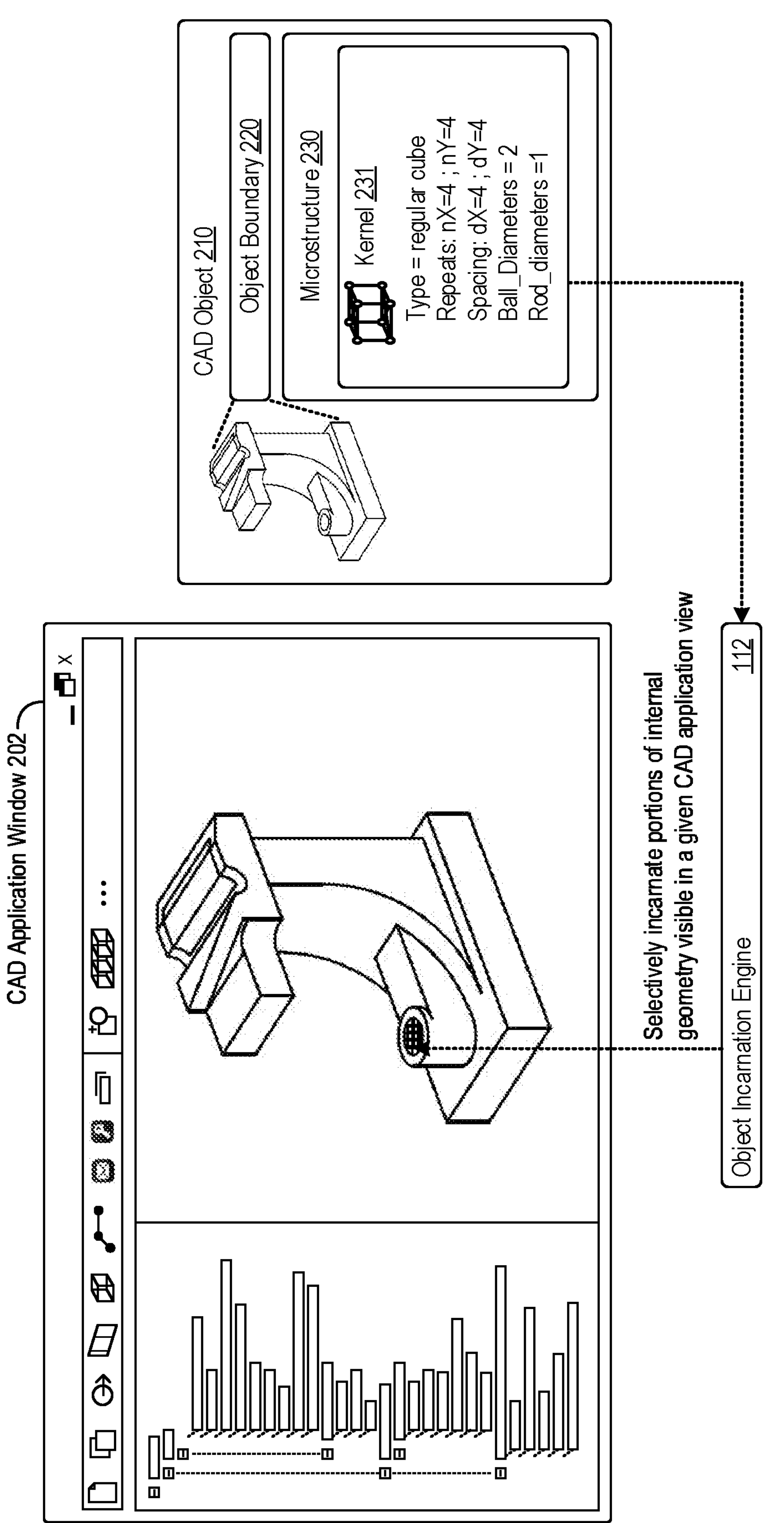
FIG. 3 shows an example incarnation of a combined representation of a CAD object by an object incarnation engine.

FIG. 3 shows an example incarnation of a combined representation of a CAD object by the object incarnation engine 112. In FIG. 3, the CAD application window 202 visualizes a CAD object 210 that may be defined as a combined representation of an object boundary 220 and microstructure 230 (e.g., including a kernel 231 patterned across an internal region of the CAD object 210).

The object incarnation engine 112 may incarnate the internal geometry of the CAD object 210 to support material-dependent CAD operations. Incarnation may refer to a process in which a procedural representation of a geometry is transformed into an express geometric representation. For instance, incarnation may be implemented by the object incarnation engine 112 by explicitly modelling internal geometry of the CAD object 210 as a B-Rep model, which may be required for proper execution of material-dependent CAD operations. A material-dependent CAD operation may refer to any CAD operation that depends on a geometric representation of any procedurally-defined portion of as a CAD object. As such, material-dependent CAD operations may include CAD operations that require a geometric representation of any portion of an interior region of a CAD object that is procedurally-defined, examples of which include rendering operations, slicing operations, and the like.

The object incarnation engine 112 may selectively incarnate portions of an internal geometry of the CAD object 210 based on a given material-dependent CAD operation to executed. Selective incarnation may include incarnating a limited portion of an internal geometry of the CAD object 210, e.g., only portions required to perform the given material-dependent CAD operation. As such, the object incarnation engine 112 may incarnate the internal geometry of the CAD object 210 by incarnating a selected portion of the internal geometry of the CAD object 210 into a geometric representation based on the material-dependent CAD operation while keeping an unselected portion of the internal geometry of the CAD object 210 in the procedural representation specified by the microstructure 230.

To illustrate, a rendering CAD operation may require incarnation of at least a portion of an internal geometry of the CAD object 210 when holes, crevices, bends, or other external geometry of the CAD object 210 expose at least a portion of the internal geometry for a given CAD application view depicted in the CAD application window 202. In such cases, the object incarnation engine 112 may, for example, incarnate the specific instances of the kernel 231 that are visible in the given CAD application view. Determination of the specific kernel instances to incarnate may be identified via ray-casting into the hole, crevice, bend, or other external geometry. Kernel instances that intersect with projected rays may be selected for incarnation, and non-intersecting kernel instances may remain in procedural form (e.g., are determined not to be incarnated by the object incarnation engine 112). As such, the object incarnation engine 112 may selectively incarnate portions of an internal geometry that are visible for rendering CAD operations, and determine not to incarnate non-visible portions.

As other illustrative examples, the object incarnation engine 112 may selectively incarnate portions of an internal geometry for mass property CAD operations. For microstructures that define a regular lattice, the object representation engine 110 may selectively incarnate segments of the lattice trimmed by the region boundaries (e.g., the object boundary 220) and otherwise use the procedural form of the lattice microstructure for the remaining portion of the internal lattice (which would thus comprise the unselected portion of the internal geometry). Bulk properties may be computed from the incarnated lattice segments, e.g., with an average mass proportionally applied across the non-incarnated portions of the CAD object 210. For sectioning CAD operations, the object incarnation engine 112 may selectively incarnate the kernel instances (or other internal geometric elements) that the procedural form indicates overlap with, touch, or otherwise directly contact the trimming plane.

In some examples, the object incarnation engine 112 may incarnate an internal geometry of the CAD object 210 (e.g., selected portions thereof) on a limited temporal basis. Incarnation into a B-Rep form by the object incarnation engine 112 may last only as long as the material-dependent CAD operation requires the geometric representation of the internal geometry for computation. By releasing B-Rep or other geometric representations of internal CAD geometries after use in CAD computations, the object incarnation engine 112 may lower memory consumption and reduce a memory footprint required for CAD system operations.

As such, the object incarnation engine 112 may selectively incarnate portion of an internal geometry of the CAD object 210 for material-dependent CAD operations. For material-independent CAD operations, the object incarnation engine 112 need not incarnate any portion of the internal geometry of the CAD object 210. That is, the object incarnation engine 112 may perform a material-independent CAD operation on the CAD object 210 without incarnating any portion of the microstructure 230, wherein the performance of the material-independent CAD operation does not depend on the internal geometry of the CAD object 210.

Through selective incarnation, the combined representation features described herein may improve computational performance. The combined representation features may provide for "model aware" microstructure definitions that incarnate as much of the interior geometry (e.g., additive material) as is needed for performing a material-dependent CAD operation, saving memory and removing the performance overhead of processing millions of elements unnecessarily as compared the express B-rep implementations.

Many of the examples described herein can be applied to provide combined representations for efficiently and effectively defining and processing additive materials that are internal to a 3D part. The combined representation features described herein, however, are not limited to internal part geometries, and can be consistently implemented for external geometries of a 3D part. External geometries may be complex in nature and not particularly conducive to efficient representation via B-Reps or other explicit geometric representations. The combined representation features may be applied for such portions of an external geometry as well, by utilizing an object boundary to enclose a selected portion of the external part geometry (e.g., via geometrically simpler B-Rep faces) and define the actual geometry of the external part geometry via a procedural representation.

In some examples in which combined representation features are used to define external geometries of a 3D part, the object boundary (e.g., B-Rep) of the combined representation need not be solid, and may instead define a void (e.g., non-solid) part boundary that bounds a microstructure providing a procedural representation of the external 3D part geometry. In such examples, even though the microstructures are internal to the object boundary in this combined representation CAD object, the microstructures themselves may procedurally define external 3D part geometry of a 3D part (that is in turn enclosed, shaped, or limited by the non-solid or partially-solid object boundary of the combined representation CAD object). As such, an internal geometry of a CAD object defined by via microstructures may represent external 3D part geometries of a 3D part and at least some of the bounding faces that encapsulate the CAD object may represent void portions (e.g., non-solid portions) or envelopes of the 3D part.

Figure 4:
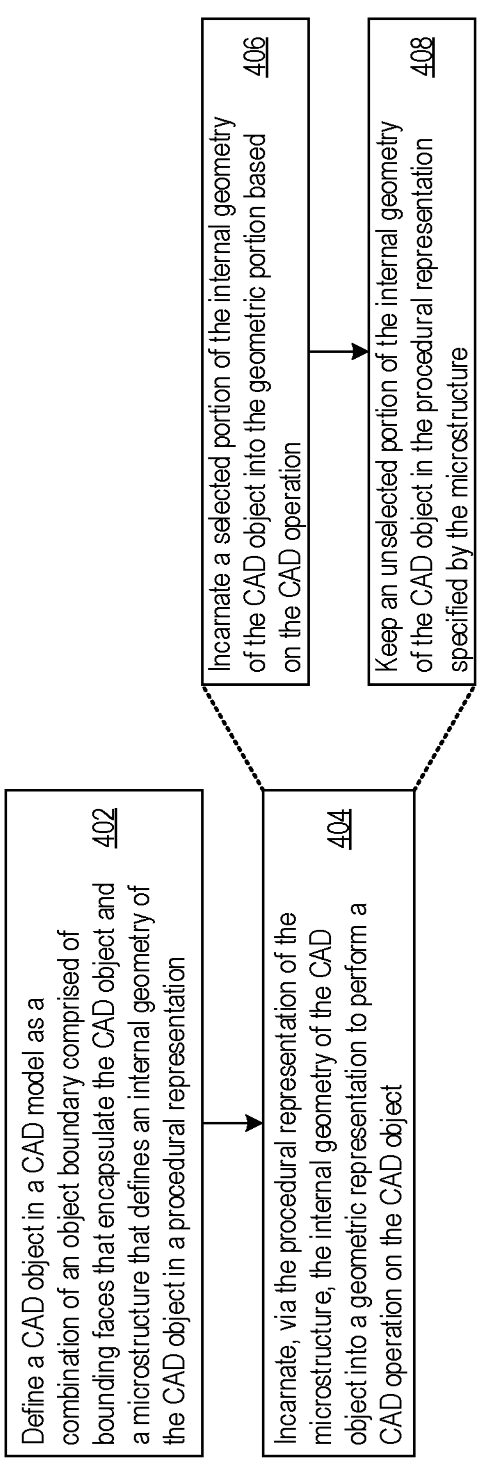
FIG. 4 shows an example of logic that a system may implement to support combined microstructure and object boundary representations of CAD objects.

FIG. 4 shows an example of logic 400 that a system may implement to support combined microstructure and object boundary representations of CAD objects. For example, the computing system 100 may implement the logic 400 as hardware, executable instructions stored on a machine-readable medium, or as a combination of both. The computing system 100 may implement the logic 400 via the object representation engine 110 and the object incarnation engine 112, through which the computing system 100 may perform or execute the logic 400 as a method to support combined microstructure and object boundary representations of CAD objects. The following description of the logic 400 is provided using the object representation engine 110 and the object incarnation engine 112 as examples. However, various other implementation options by systems are possible.

In implementing the logic 400, the object representation engine 110 may define a CAD object in a CAD model as a combination of an object boundary comprised of bounding faces that encapsulate the CAD object and a microstructure that defines an internal geometry of the CAD object in a procedural representation (402). The procedural representation of the microstructure may be a representation of the internal geometry of the CAD object in a non-incarnated form.

In implementing the logic, the object incarnation engine 112 may to incarnate, via the procedural representation of the microstructure, the internal geometry of the CAD object into a geometric representation to perform a CAD operation on the CAD object (404). For instance, the object incarnation engine 112 may incarnate a selected portion of the internal geometry of the CAD object into the geometric representation based on the CAD operation (406) and keep an unselected portion of the internal geometry of the CAD object in the procedural representation specified by the microstructure (408).

The logic 400 shown in FIG. 4 provides an illustrative example by which a computing system 100 may support combined microstructure and object boundary representations of CAD objects. Additional or alternative steps in the logic 400 are contemplated herein, including according to any features described herein for the object representation engine 110, object incarnation engine 112, or any combinations thereof.

Figure 5:
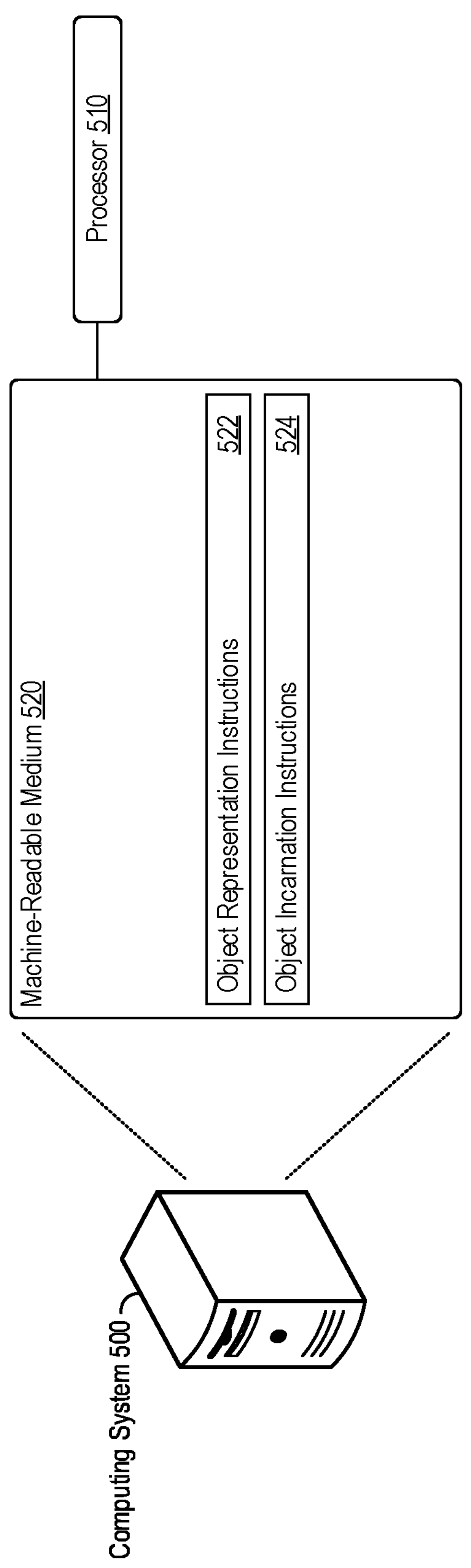
FIG. 5 shows an example of a computing system that supports combined microstructure and object boundary representations of CAD objects.

FIG. 5 shows an example of a computing system 500 that supports combined microstructure and object boundary representations of CAD objects. The computing system 500 may include a processor 510, which may take the form of a single or multiple processors. The processor(s) 510 may include a central processing unit (CPU), microprocessor, or any hardware device suitable for executing instructions stored on a machine-readable medium. The system 500 may include a machine-readable medium 520. The machine-readable medium 520 may take the form of any non-transitory electronic, magnetic, optical, or other physical storage device that stores executable instructions, such as the object representation instructions 522 and the object incarnation instructions 524 shown in FIG. 5. As such, the machine-readable medium 520 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 500 may execute instructions stored on the machine-readable medium 520 through the processor 510. Executing the instructions (e.g., the object representation instructions 522 and/or the object incarnation instructions 524) may cause the computing system 500 to perform any of the combined representation features described herein, including according to any of the features with respect to the object representation engine 110, the object incarnation engine 112, or a combination of both.

For example, execution of the object representation instructions 522 by the processor 510 may cause the computing system 500 to define a CAD object in a CAD model as a combination of an object boundary comprised of bounding faces that encapsulate the CAD object and a microstructure that defines an internal geometry of the CAD object in a procedural representation. The procedural representation of the microstructure may b a representation of the internal geometry of the CAD object in a non-incarnated form. Execution of the object incarnation instructions 524 may cause the computing system 500 to incarnate, via the procedural representation of the microstructure, the internal geometry of the CAD object into a geometric representation to perform a CAD operation on the CAD object.

Any additional or alternative features as described herein may be implemented via the object representation instructions 522, object incarnation instructions 524, or a combination of both.

The systems, methods, devices, and logic described above, including the object representation engine 110 and the object incarnation engine 112, may be implemented in many different ways in many different combinations of hardware, logic, circuitry, and executable instructions stored on a machine-readable medium. For example, the object representation engine 110, the object incarnation engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the object representation engine 110, the object incarnation engine 112, or combinations thereof.

The processing capability of the systems, devices, and engines described herein, including the object representation engine 110 and the object incarnation engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:

by a computing system:

defining a computer-aided design (CAD) object in a CAD model as a combination of:

an object boundary comprised of bounding faces that encapsulate the CAD object; and a microstructure that defines an internal geometry of the CAD object in a procedural representation, wherein the procedural representation is a representation of the internal geometry of the CAD object in a non-incarnated form; and incarnating, via the procedural representation of the microstructure, the internal geometry of the CAD object into a geometric representation to perform a CAD operation on the CAD object; and further performing a material-independent CAD operation on the CAD object without incarnating any portion of the microstructure, wherein the performance of the material-independent CAD operation does not depend on the internal geometry of the CAD object and wherein the material-independent CAD operation comprises a change to the object boundary of the CAD object.

2. The method of claim 1, wherein the procedural representation of the microstructure comprises a procedurally-defined kernel that is repeated across an interior of the object boundary to define the internal geometry of the CAD object.

3. The method of claim 1, wherein the object boundary comprises a boundary representation of the CAD object; and wherein defining the CAD object comprises embedding the procedural representation of the microstructure into the boundary representation of the CAD object.

4. The method of claim 1, further comprising:

representing the CAD object as a non-manifold object to a geometric modeler component of a CAD application; and masking the non-manifold object by representing the CAD object as a manifold object to a different component of the CAD application.

5. The method of claim 1, wherein incarnating the internal geometry comprises:

incarnating a selected portion of the internal geometry of the CAD object into the geometric representation based on the CAD operation; and keeping an unselected portion of the internal geometry of the CAD object in the procedural representation specified by the microstructure.

6. The method of claim 1, further comprising adapting the microstructure that defines the internal geometry of the CAD structure to account for the change in the object boundary.

7. A system comprising:

a processor; and a non-transitory machine-readable medium comprising instructions that, when executed by the processor, cause a computing system to:

define a computer-aided design (CAD) object in a CAD model as a combination of:

an object boundary comprised of bounding faces that encapsulate the CAD object; and a microstructure that defines an internal geometry of the CAD object in a procedural representation, wherein the procedural representation is a representation of the internal geometry of the CAD object in a non-incarnated form; and incarnate, via the procedural representation of the microstructure, the internal geometry of the CAD object into a geometric representation to perform a CAD operation on the CAD object; and further perform a material-independent CAD operation on the CAD object without incarnating any portion of the microstructure, wherein the performance of the material-independent CAD operation does not depend on the internal geometry of the CAD object and wherein the material-independent CAD operation comprises a change to the object boundary of the CAD object.

8. The system of claim 7, wherein the procedural representation of the microstructure comprises a procedurally-defined kernel that is repeated across an interior of the object boundary to define the internal geometry of the CAD object.

9. The system of claim 7, wherein the object boundary comprises a boundary representation of the CAD object; and wherein the instructions cause the computing system to define the CAD object by embedding the procedural representation of the microstructure into the boundary representation of the CAD object.

10. The system of claim 7, wherein the instructions further cause the computing system to:

represent the CAD object as a non-manifold object to a geometric modeler component of a CAD application; and mask the non-manifold object by representing the CAD object as a manifold object to a different component of the CAD application.

11. The system of claim 7, wherein the instructions cause the computing system to incarnate the internal geometry by:

incarnating a selected portion of the internal geometry of the CAD object into the geometric representation based on the CAD operation; and keeping an unselected portion of the internal geometry of the CAD object in the procedural representation specified by the microstructure.

12. The system of claim 7, wherein the internal geometry of the CAD object defined by the microstructure represents an external 3-dimensional (3D) part geometry of a 3D part; and wherein at least some of the bounding faces that encapsulate the CAD object represent void portions of the 3D part.

13. A non-transitory machine-readable medium comprising instructions that, when executed by a processor, cause a computing system to:

define a computer-aided design (CAD) object in a CAD model as a combination of:

an object boundary comprised of bounding faces that encapsulate the CAD object; and a microstructure that defines an internal geometry of the CAD object in a procedural representation, wherein the procedural representation is a representation of the internal geometry of the CAD object in a non-incarnated form; and incarnate, via the procedural representation of the microstructure, the internal geometry of the CAD object into a geometric representation to perform a CAD operation on the CAD object; and further perform a material-independent CAD operation on the CAD object without incarnating any portion of the microstructure, wherein the performance of the material-independent CAD operation does not depend on the internal geometry of the CAD object.

14. The non-transitory machine-readable medium of claim 13, wherein the procedural representation of the microstructure comprises a procedurally-defined kernel that is repeated across an interior of the object boundary to define the internal geometry of the CAD object.

15. The non-transitory machine-readable medium of claim 13, wherein the object boundary comprises a boundary representation of the CAD object; and wherein the instructions cause the computing system to define the CAD object by embedding the procedural representation of the microstructure into the boundary representation of the CAD object.

16. The non-transitory machine-readable medium of claim 13, wherein the instructions further cause the computing system to:

represent the CAD object as a non-manifold object to a geometric modeler component of a CAD application; and mask the non-manifold object by representing the CAD object as a manifold object to a different component of the CAD application.

17. The non-transitory machine-readable medium of claim 13, wherein the instructions cause the computing system to incarnate the internal geometry by:

incarnating a selected portion of the internal geometry of the CAD object into the geometric representation based on the CAD operation; and keeping an unselected portion of the internal geometry of the CAD object in the procedural representation specified by the microstructure.

* * * * *